(12) United States Patent
Kataoka et al.

(10) Patent No.: US 6,307,145 B1
(45) Date of Patent: *Oct. 23, 2001

(54) SOLAR CELL MODULE

(75) Inventors: Ichiro Kataoka, Kyotanabe; Takahiro Mori, Ikoma; Satoru Yamada, Kyotanabe; Hidenori Shiotsuka; Ayako Shiotsuka, both of Nara, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/942,118

(22) Filed: Oct. 1, 1997

(30) Foreign Application Priority Data

Oct. 8, 1996 (JP) .................................... 8-266824

(51) Int. Cl.[7] .................................... H01L 31/048
(52) U.S. Cl. .................... 136/251; 136/258; 136/259; 136/256; 257/433; 257/788; 257/789; 257/790; 257/795; 52/173.3
(58) Field of Search .................... 136/251, 258, 136/259, 256; 257/433, 788, 789, 790, 795; 52/173.3

(56) References Cited

U.S. PATENT DOCUMENTS

| 5,389,159 | * | 2/1995 | Kataoka et al. | 136/251 |
| 5,578,141 | | 11/1996 | Mori | 136/251 |
| 5,660,646 | * | 8/1997 | Kataoka et al. | 136/251 |
| 5,684,325 | | 11/1997 | Kataoka | 257/433 |
| 5,849,107 | * | 12/1998 | Kataoka et al. | 136/248 |

FOREIGN PATENT DOCUMENTS

| 536738 | * | 4/1993 | (EP) . |
| 0 536 738 | | 4/1993 | (EP) . |
| 0 577 985 | | 1/1994 | (EP) . |
| 0 641 030 | | 3/1995 | (EP) . |
| 0 646 682 | | 4/1995 | (EP) . |
| 0 658 943 | | 6/1995 | (EP) . |
| 0 680 095 | | 11/1995 | (EP) . |
| 680098 | * | 11/1995 | (EP) . |
| 0 680 097 | | 11/1995 | (EP) . |
| 8-139350 | * | 5/1996 | (JP) . |

OTHER PUBLICATIONS

Semi–Annual Technical Progress Report on Photovoltaic Manufacturing Technology (PVMat), Springborn Laboratories, Nov. 5, 1993.

* cited by examiner

*Primary Examiner*—Alan Diamond
(74) *Attorney, Agent, or Firm*—Fitzpatrick, Cella, Harper & Scinto

(57) ABSTRACT

A solar cell module is constructed in such an arrangement that a photovoltaic element is covered by at least a sealant resin and a surface protecting film, wherein the oxygen permeability of the surface protecting film is not less than 1 cc/m$^2$·24 hr·atm and not more than 50 cc/m$^2$·24 hr·atm at 25° C./90% RH, thereby providing the solar cell module with high reliability, free of deterioration of the sealant resin, particularly free of yellowing, in long-term outdoor exposure use.

26 Claims, 6 Drawing Sheets

SOLAR CELL MODULE

BACKGROUND OF THE INVENTION

1. Field of the Invention

The present invention relates to a solar cell module and, more particularly, to a solar cell module in which a light-incidence-side surface of a photovoltaic element is sealed by a covering member comprised of at least two layers including a sealant resin layer of a transparent, organic polymer resin and an outermost, transparent surface protecting film.

2. Related Background Art

In recent years, the increase in awareness of environmental issues is spreading on a worldwide scale. Among others, the concern over the warming phenomenon of the earth due to emission of $CO_2$ is deepening, and demands are becoming greater for clean energy. Solar cells can be considered at present a promising clean energy source because of their safety and ease in handling.

Various forms of solar cells are known. Typical examples are as follows:

(1) Crystalline silicon solar cells
(2) Polycrystalline silicon solar cells
(3) Amorphous silicon solar cells
(4) Copper indium selenide solar cells
(5) Compound semiconductor solar cells Among these, the thin film crystalline silicon solar cells, compound semiconductor solar cells, and amorphous silicon solar cells have recently been the subject of research and development on many fronts, because they can be made in a large area at relatively low cost.

Further, among these solar cells, the thin film solar cells, typified by an amorphous silicon solar cell in which silicon is deposited on a conductive metal substrate and a transparent, conductive layer is formed thereon, are considered to be promising for future module forms, because they are lightweight, impact-resistant, and very flexible. It is, however, necessary to cover the light-incidence-side surface with a transparent covering member to protect the solar cell, different from those obtained by depositing silicon on a glass substrate.

The most popular way is to employ glass as the outermost surface and bond the glass to the solar cell element with a sealant resin. Since glass is excellent in weathering resistance and is not permeable to moisture, it can be said to be one of the most excellent members for covering the photovoltaic element of a semiconductor. Therefore, most solar cell modules employ glass as the cover of the outermost surface. The glass cover, however, has problems: 1) it is heavy; 2) it cannot be bent; 3) it is weak against impact; and 4) it is expensive. These problems weigh against making use of the advantages of thin film solar cells, i.e., being lightweight, impact-resistant, and flexible.

Proposals thus have been made heretofore for lightweight, flexible solar cell modules taking advantage of the features of thin film solar cells by using a surface covering member in which the outermost surface is of a transparent fluoride polymer thin film such as a fluororesin film and in which a sealant selected from a variety of thermoplastic, transparent, organic resins is provided inside thereof. Reasons why these materials have been used are: 1) that the fluoride polymers are high in weathering resistance and water repellency, which can lessen the drop of conversion efficiency of a solar cell module due to decrease in optical transmittance resulting from yellowing or clouding caused by resin deterioration or from surface pollution and 2) that the thermoplastic, transparent resins are cheap and can be used in large quantity as a sealant for protecting the internal photovoltaic element. Normally, provided on the solar cell elements are various collector electrodes for efficiently drawing power generated and metal members for connecting the elements in series or in parallel with each other. The thermoplastic, transparent, organic resins also have an effect of smoothing the surface of a covering member by also sealing packaging members including the electrodes and metal members to fill unevenness on the surface of the element.

However, such modules wherein the surface is covered by a film, have a problem that the element is easier to scratch, different from those wherein the surface is covered by glass. Namely, when the surface is scratched by a sharp edge, even the element would be damaged readily.

In order to relieve this problem, even a little, a reinforcing material is put into the sealant resin, and nonwoven fabric of glass fiber is suitably used for this purpose. The nonwoven fabric of glass fiber also functions to maintain the thickness of the sealant resin, because the molten sealant resin is impregnated thereinto in a module lamination step by a heating press method under vacuum, and it functions to reduce bubbles remaining in the sealant resin by securing ways of escape of air when interposed between the sealant resin and the surface member and/or between the sealant resin and the solar cell element upon pressing under vacuum.

It is required that the solar cell modules are designed to endure 20-year outdoor use. Especially, high durability is required of the surface covering member comprised of the surface sealant resin layer, the surface protecting film, etc., exposed to direct sunlight. Outdoor use factors which cause deterioration include ultraviolet rays, heat, water, and so on. Among them, yellowing of the surface sealant resin layer due to ultraviolet rays and heat is a serious problem, because it results in decreasing the quantity of light reaching the photovoltaic element and thus lowering the output of the solar cell module.

Many reports have been presented heretofore about the yellowing of the surface sealant resin layer. For example, the report by SPRINGBORN LABORATORIES INC., "SEMI-ANNUAL TECHNICAL PROGRESS REPORT ON PHOTOVOLTAIC MANUFACTURING TECHNOLOGY (PV Mat), Nov. 5, 1993," describes that yellowing is likely to occur in EVA used as a surface sealant resin layer in modules installed in a desert area, e.g., in Phoenix, U.S.A. Not only in such use in the desert area, but also in use where the solar cell modules per se function as a roof, for example, like a combination roofing member and solar cell, the temperatures of modules increase up to 70° C. or more and the yellowing becomes a serious problem.

Therefore, the durability of the surface sealant resin layer is enhanced by adding an ultraviolet absorbing agent, a light stabilizer, a thermal oxidation inhibiter, or the like thereto so as to endure even under severe use circumstances of the ordinary solar cell. Nevertheless, deterioration thereof unavoidably occurs because of exposure to harsh ultraviolet rays and heat over several tens of years. Thus, reliability is not sufficient yet and still more countermeasures are desired against the yellowing.

Further, the nonwoven fabric of glass fiber is often put in the surface sealant resin layer as described above, but studies by the inventor showed that it tended to be a big factor in causing the yellowing. The reason is considered to be in a binder resin for binding glass fibers with each other. As compared with the weathering resistance of the surface sealant resin layer, the weathering resistance of the binder resin in the nonwoven fabric of glass fiber is not so high per se, and the binder resin does not contain an additive for enhancing the weathering resistance. Therefore, the binder resin is more likely to be deteriorated than the surface sealant resin layer. Since the binder resin is of a different kind from the surface sealant resin layer, the binder resin is not mixed well with the surface sealant resin layer, and water thus could enter interfaces between them, promoting further deterioration.

For example, it was shown that in an example wherein EVA was used for the surface sealant resin layer and a polyvinyl alcohol resin for the binder resin in the nonwoven fabric of glass fiber, yellowing occurred mainly due to the deterioration of the binder resin in accelerated weathering tests such as the EMMAQUA test, sunshine weatherometer test, and strong ultraviolet irradiation test and in thermal degrading tests at 150° C. The reason is generation of conjugated double bonds in main chains of polyvinyl alcohol polymer due to thermal dehydration.

On the other hand, a rigid resin thin film layer containing the main component of an acrylic resin is sometimes provided between the photovoltaic element and the surface sealant resin layer for the purposes of enhancing scratch resistance of the surface covering member and providing the photovoltaic element with a humidity barrier property. In this case, however, our experiment results showed that a crosslinking agent (organic peroxide) remaining in the surface sealant resin layer interacted with the acrylic resin to accelerate the yellowing of the surface sealant resin.

SUMMARY OF THE INVENTION

For overcoming the aforementioned defects, an object of the present invention is to provide a solar cell module with high reliability free of deterioration of sealant resin in outdoor exposure use for a long period, especially, free of yellowing.

The inventors conducted extensive and intensive research and development for solving the above problems and found that the following method was the best. Specifically, a solar cell module of the present invention is a solar cell module in which a photovoltaic element is covered by at least a sealant resin and a surface protecting film, wherein an oxygen permeability of the surface protecting film is not less than 1 $cc/m^2 \cdot 24$ hr·atm and not more than 50 $cc/m^2 \cdot 24$ hr·atm at 25° C./90% RH.

DESCRIPTION OF THE PREFERRED EMBODIMENTS

Figure 1A:
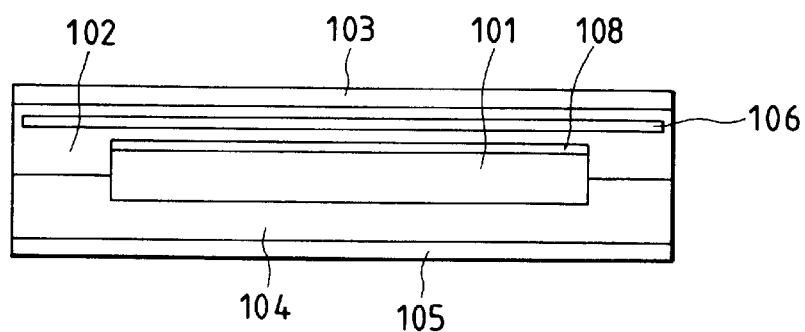
FIG. 1A and FIG. 1B are schematic, cross-sectional views of examples of a solar cell module.
Figure 1B:
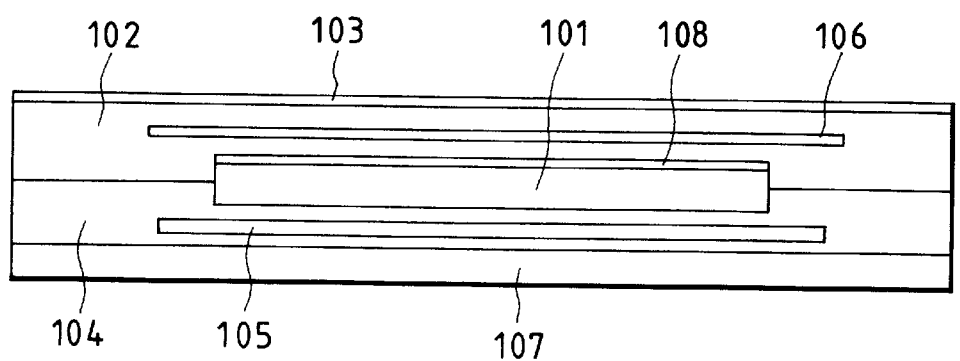

FIG. 1A is a view showing the schematic structure of a solar cell module according to the present invention. Reference numeral 101 designates a photovoltaic element, the light-incidence-side surface of which is covered by a surface covering member comprised of at least a transparent surface sealant resin layer 102 and a transparent surface protecting film 103 located on the outermost surface side. Numeral 104 denotes a back sealant resin layer, 105 a back covering film, and 106 a nonwoven fabric of glass fiber. Light from the outside is incident to the outermost surface protecting film 103 to reach the photovoltaic element 101 and electromotive force generated is taken out through output terminals (not illustrated). FIG. 1B shows an example having a module backing 107 on the back surface of the solar cell module of FIG. 1A. In FIGS. 1A and 1B numeral 108 denotes a transparent, rigid, organic resin thin film layer provided on the light incidence side of the photovoltaic element 101.

Surface Protecting Film 103

Since the surface protecting film 103 employed in the present invention is located as the outermost layer of the solar cell module, it needs to provide long-term reliability in outdoor exposure of solar cell module, including weathering resistance, pollution resistance, and mechanical strength.

The oxygen permeability of the surface protecting film 103 needs to be not less than 1 $cc/m^2 \cdot 24$ hr·atm and not more than 50 $cc/m^2 \cdot 24$ hr·atm at 25° C./90% RH and, preferably, not less than 10 $cc/m^2 \cdot 24$ hr·atm and not more than 50 $cc/m^2 \cdot 24$ hr·atm.

Figure 4:
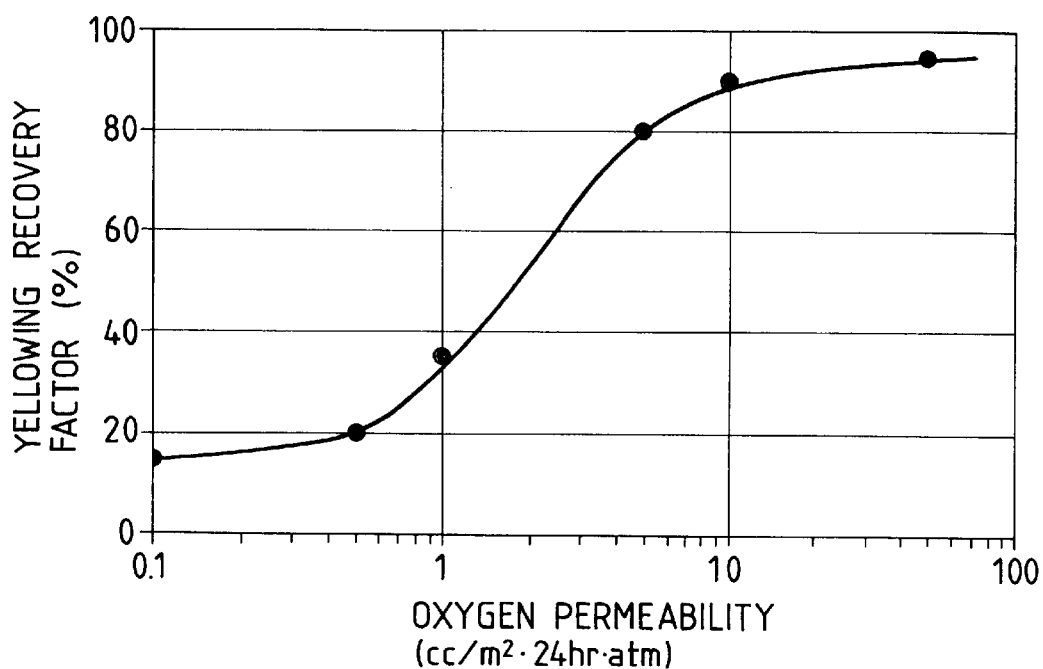
FIG. 4 is a graph showing the relationship between oxygen permeability and yellowing recovery factor.

FIG. 4 is a graph to show the relation between oxygen permeability at 25° C./90% RH of the surface protecting film and yellowing recovery factor of the surface covering member. The relation between oxygen permeability and yellowing recovery factor was obtained as follows. A lamination was formed on slide glass in such a structure that the outermost surface was an organic resin film as the surface protecting film and that an EVA resin containing the nonwoven fabric of glass fiber was sealed between the slide glass and the organic resin film. The EVA resin containing glass fibers corresponds to the surface sealant resin layer in the solar cell module of the present invention. This lamination was subjected to a thermal degrading test at 150° C. and for 15 hours. The thermal degrading test showed that yellowing of the sealant resin layer occurred, thereby greatly decreasing the optical transmittance and that the decrease was equivalent to an almost 10% drop in output of the solar cell module. Then it was exposed to ultraviolet rays under the output of 100 $mW/cm^2$ in the wavelength range of 300 to 400 nm by use of a metal halide lamp. The yellowing recovery factor is defined as a relative value when the optical transmittance (at wavelength 400 nm) immediately after the thermal degrading test is determined to be 0 and when the transmittance (at wavelength 400 nm) immediately after fabrication of the lamination is determined to be 100%.

It is clear from FIG. 4 that considerable recovery from yellowing is recognized if the oxygen permeability of the surface protecting film is at least 1 $cc/m^2 \cdot 24$ hr·atm and that recovery is almost perfectly made to the initial transmittance if the oxygen permeability is 10 $cc/m^2 \cdot 24$ hr·atm or more.

Namely, supply of more oxygen to the sealant resin facilitates the recovery from yellowing during the exposure to ultraviolet light. A mechanism for this recovery is conceivably such that conjugated double bonds in main chains of polymer, which are the cause of yellowing, are reduced by oxygen radicals generated by ultraviolet irradiation over oxygen molecules having diffused into the sealant resin layer.

Under actual outdoor use circumstances, the yellowing by heat and the yellowing dissolving action with ultraviolet light plus oxygen are so-called competitive reactions simultaneously taking place.

Even under such circumstances, the yellowing can be suppressed by the supply of oxygen.

On the other hand, the sealant resin layer is normally crosslinked by radicals produced by thermal decomposition of an organic peroxide. A small amount of the organic peroxide usually remains in the sealant resin layer without being decomposed completely. Since the organic peroxide has the ability to promote the yellowing of the sealant resin layer, the remaining amount thereof after crosslinking of sealant resin should be preferably controlled as small as possible. Increasing the oxygen permeability of the surface protecting film makes possible volatilization of the remaining organic peroxide through the surface protecting film and thus results in further enhancing the yellowing suppressing effect.

However, the permeability of water vapor also increases with an increase in the oxygen permeability. Intrusion of water vapor into the sealant resin layer would result in lowering the adhesive force of the sealant resin layer to the other material and causing peeling of the surface covering member. It also causes degradation of electrical insulation of the surface covering member and degradation of performance of the photovoltaic element due to water. Accordingly, the oxygen permeability of the surface protecting film needs to be not more than 50 cc/m$^2$·24 hr·atm. More specifically, the water vapor permeability of the surface protecting film is more preferably 20 g/m$^2$·24 hr or less at 40° C./90% RH. The lower limit of water vapor permeability of the surface protecting film is more preferably 1.0 g/m$^2$·24 hr at 40° C./90% RH.

Materials suitably used for the surface protecting film 103 are, for example, fluoride polymers and acrylic resins. Among them, fluoride polymers are favorably used, because they are excellent in the weathering resistance and pollution resistance. Specific examples include polyvinylidene fluoride resins, polyvinyl fluoride resins, and tetrafluoroethylene-ethylene copolymers. The polyvinylidene fluoride resins are excellent in terms of weathering resistance, while the tetrafluoroethylene-ethylene copolymers are excellent in terms of compatibility of weathering resistance and mechanical strength, and transparency.

The surface protecting film 103 needs to have some thickness for securing the mechanical strength, but too great thicknesses are not preferred from the viewpoint of cost. Specifically, the thickness is preferably 20–200 μm and more preferably 30–100 μm.

For improving adhesion with the surface sealant resin layer 102, one surface of the surface protecting film 103 is preferably treated by a surface treatment such as corona treatment, plasma treatment, ozone treatment, UV irradiation, electron beam irradiation, or flame treatment. Among them, corona discharge treatment is preferably used, because its treatment rate is large and it can increase the adhesive force greatly by a relatively simple device.

Surface Sealant Resin Layer 102

The surface sealant resin layer 102 is necessary for covering unevenness of the photovoltaic element 101 with a resin, for protecting the photovoltaic element 101 from severe external circumstances such as temperature change, humidity, and impact, and for securing adhesion between the surface protecting film 103 and the photovoltaic element 101. Therefore, it needs to be excellent in weathering resistance, adhesion, filling property, heat resistance, low temperature resistance, and impact resistance.

Resins which meet these requirements include, for example, polyolefin-based resins such as ethylene-vinyl acetate copolymers (EVA), ethylene-methylacrylate copolymers (EMA), ethylene-ethylacrylate copolymers (EEA), and polyvinyl butyral resins, urethane resins, silicone resins, and fluororesins. Among them, EVA is preferably used, because it has well-balanced physical properties for use in a solar cell.

The surface sealant resin layer is preferably crosslinked in order to enhance the heat resistance, and the crosslinking is more preferably controlled so as to achieve the gel percentage of 70 wt % or more. Particularly, in the case of EVA, it is preferably crosslinked with the organic peroxide, which can effectively prevent deformation or creep under use at high temperatures.

The crosslinking with the organic peroxide is made in such a way that free radicals produced from the organic peroxide draw hydrogen and halogen atoms in the resin to form C—C bonds. The known methods for activating the organic peroxide include thermal decomposition, redox decomposition, and ion decomposition. In general, the thermal decomposition method is favorably adopted. Specific examples of the organic peroxide include, for example, hydroperoxide, dialkyl (allyl) peroxide, diacyl peroxide, peroxy ketal, peroxy ester, peroxy carbonate, ketone peroxide, and so on. An amount of the organic peroxide added is preferably 0.5 to 5 parts by weight relative to 100 parts by weight of the surface sealant resin.

The resins used for the surface sealant resin layer 102 are those excellent in the weathering resistance, but an ultraviolet absorbing agent may also be added in order to further enhance the weathering resistance or in order to protect the layer located below the surface sealant resin layer. The ultraviolet absorbing agent can be selected from known compounds and is selected preferably from low-volatility ultraviolet absorbing agents in consideration of use environments of the solar cell module. Specific examples of such agents are various organic compounds including salicylic acid-based compounds, benzophenone-based compounds, benzotriazole-based compounds, and cyanoacrylate-based compounds.

If a light stabilizer is also added together with the ultraviolet absorbing agent, the surface sealant resin layer 102 will become more stable to light. Typical examples of the light stabilizer are hindered amine-based light stabilizers. The hindered amine-based light stabilizers do not absorb the ultraviolet light, different from the ultraviolet absorbing agent, but they demonstrate a great synergistic effect when used with the ultraviolet absorbing agent. There are, of course, other compounds functioning as a light stabilizer than the hindered amine-based stabilizers, but colored stabilizers are not preferred for the surface sealant resin layer 102 of the present invention. The amounts of the above ultraviolet absorbing agent and light stabilizer added are preferably 0.1–1.0 wt % and 0.05–1.0 wt %, respectively, to the surface sealant resin.

Further, a thermal oxidation inhibitor may be added for improving the thermal resistance and thermal processability. The thermal oxidation inhibitor may be selected, for example, from monophenol-based compounds, bisphenol-based compounds, polymer type phenol-based compounds, sulfur-based compounds, and phosphoric acid-based compounds. The amount of the thermal oxidation inhibitor added is preferably 0.05–1.0 wt % of the surface sealant resin.

A silane coupling agent or an organic titanate compound can be added to the surface sealant resin, for further enhancing adhesion between the glass fibers 106 described below and the surface sealant resin. It also presents an effect to enhance the adhesive force between the surface sealant resin layer 102 and the photovoltaic element 101 or the surface protecting film 103. An amount of the addition is preferably 0.1–3 parts by weight and more preferably 0.25–1 part by weight to 100 parts by weight of the surface sealant resin.

On the other hand, the surface sealant resin layer 102 needs to be transparent in order to control a decrease in the quantity of light reaching the photovoltaic element 101 to as a low level as possible. Specifically, the optical transmittance thereof is preferably 80% or more and more preferably 90% or more in the visible light wavelength region of 400 nm inclusive to 800 nm inclusive. For facilitating incidence of light from the atmosphere, the refractive index of the surface sealant resin layer 102 at 25° C. is preferably between 1.1 and 2.0 and more preferably between 1.1 and 1.6.

EVA sheets for a solar cell in a sheet form of EVA containing the above additives are commercially available. Examples of such commercially available EVA sheets are solar EVA from Hisheet Kogyo Kabushiki Kaisha, EVASAFE WG series from BRIDGESTONE CORP., PHOTOCAP from SPRINGBORN LABORATORIES INC., and so on.

One selected from these is put between the photovoltaic element 101 and the surface member such as the surface protecting film 103, and they are pressed under heat, whereby the solar cell module can be fabricated readily.

Glass Fiber Nonwoven Fabric 106

The surface sealant resin layer 102 preferably contains the glass fiber nonwoven fabric 106. The glass fiber nonwoven fabric 106 facilitates degassing from spaces in the solar cell module lamination in a vacuuming step in a vacuum lamination process and prevents the surface sealant resin from flowing to the module edges to thin the surface sealant resin layer 102, as being impregnated in the surface sealant resin of EVA or the like melted in a heating step. Further, since the glass fiber nonwoven fabric 106 is impregnated in the surface sealant resin, it also functions as a reinforcing material of the surface sealant resin layer 102, thereby making more difficult the propagation of flaw in the surface to the photovoltaic element 101.

The glass fiber nonwoven fabric 106 is obtained by binding glass fibers with a binder resin. The binder resin may be selected, for example, from acrylic resins, urethane resins, polyvinyl alcohol resins, polyester resins, and EVA resins, and it is selected preferably from the acrylic resins in terms of the heat resistance.

The amount of the glass fiber nonwoven fabric 106 to the surface sealant resin is preferably 1–30 parts by weight and more preferably between 5–20 parts by weight to 100 parts by weight of the surface sealant resin. If the amount is below one part by weight, there is such a tendency that the surface covering member is unlikely to have sufficient scratch resistance. If the amount is over 30 parts by weight, an amount of glass fibers will be excessive to the surface sealant resin, which will cause failure of appearance, because the glass fiber nonwoven fabric is not impregnated well in the surface sealant resin in the module lamination step or which will readily raise a problem of poor appearance or separation of glass fibers from the surface sealant resin layer 102 in long-term outdoor exposure.

The surface of the surface covering member is often provided with unevenness in consideration of a decrease of reflected light, suppression of wrinkling upon lamination, design, and so on. The maximum level difference between adjacent depressed and projected portions of the unevenness is preferably between 5 µm inclusive and 100 µm inclusive. If the maximum level difference is below 5 µm, there is such a tendency that the effect of the provision of the unevenness is not demonstrated well. If the maximum level difference is over 100 µm, the surface sealant resin layer 102 will be locally thin in depressed portions where the amount of glass fibers tends to be excessive to the surface sealant resin. With too deep unevenness, thus, glass fibers tend to be separated readily from the surface sealant resin layer 102 in the depressed portions, thereby affecting the weather resistance of the surface covering member. This unevenness may be formed during a cover forming step or may be formed by a method of pressing or the like after formation of a cover.

Back Sealant Resin Layer 104

The back sealant resin layer 104 promotes adhesion between the photovoltaic element 101 and the back covering film 105. Preferred materials for the back sealant resin layer 104 are capable of securing sufficient adhesion to the substrate, excellent in long-term durability, resistant to thermal expansion and thermal contraction, and flexible. Preferably used materials are, for example, resins including hot melt materials such as EVA, EEA, or polyvinyl butyral, and epoxy adhesives having flexibility, and two-sided adhesive tapes. It is a matter of course that the back sealant resin layer 104 can also be made of the same material as the surface sealant resin layer 102, which is normally the case in many applications.

Back Covering Film 105

The back covering film 105 is necessary for maintaining electrical insulation between the substrate of the photovoltaic element 101 and the outside. Preferred materials are capable of securing sufficient electrical insulation to the substrate, excellent in long-term durability, resistant to thermal expansion and thermal contraction, and flexible. Suitably applicable films are, for example, films of nylons and polyethylene terephthalate. It is also possible to use a lamination film in which the back sealant resin 104 and back covering film 105 described above are preliminarily stacked together.

Module Backing 107

The module backing may be adhered to the outside of back covering film 105 in order to increase the mechanical strength of the solar cell module or in order to prevent distortion or warpage due to temperature change. The backing 107 is preferably selected, for example, from steel sheets, plastic sheets, FRP (glass fiber reinforced plastics) sheets, or flexible resin sheets.

Figure 5A:
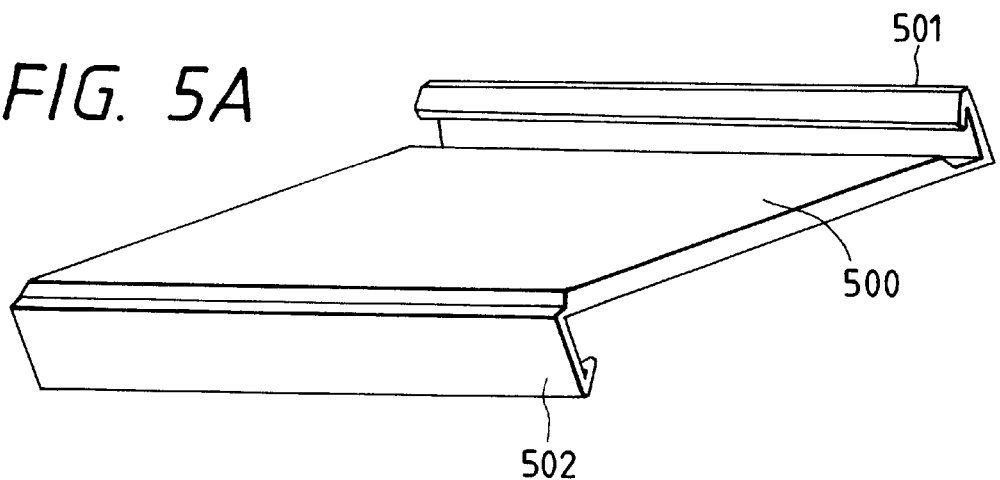
FIG. 5A, FIG. 5B, and FIG. 5C are views each showing an example of building materials in the present invention.
Figure 5B:
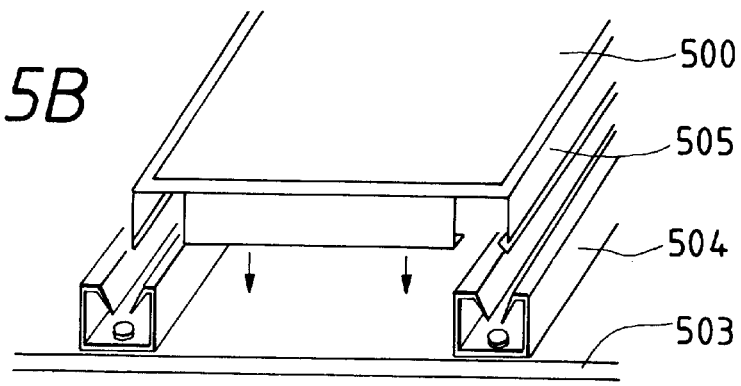
Figure 5C:
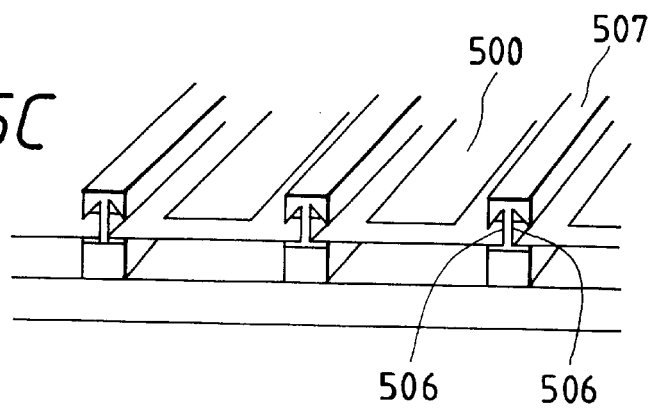

When a steel sheet is used as the module backing 107, a building material such as a wall material or a roofing material incorporating the solar cell can be made by folding it. FIGS. 5A–5C show examples of roofing materials according to the present invention.

FIG. 5A shows a roofing material of a type where ridge-side connecting portion 501 and eaves-side connecting portion 502 are semi-jointed with each other. FIG. 5B shows a roofing material of a type where engaging portions thereof 505 are fitted in fixing members 504 fixed on sheathing roof board 503. FIG. 5C shows roofing materials connecting parts of which are covered by caps 507 after adjacent roofing materials are connected at connecting parts thereof 506 by the fixing members. A photovoltaic element 500 is provided in a light receiving surface of each roofing material in the examples shown.

Figure 6:
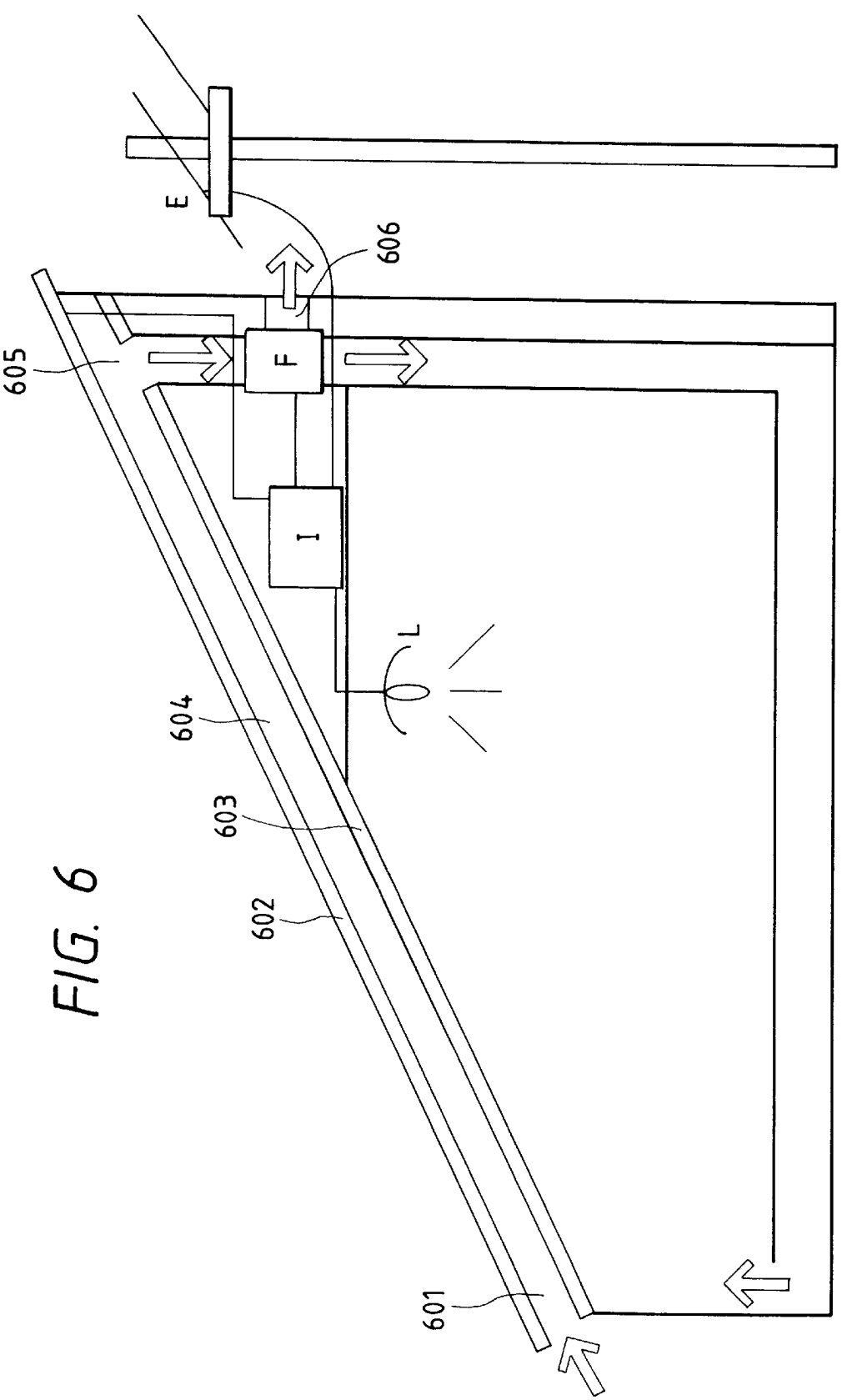
FIG. 6 is a view showing an air circulation system according to the present invention.

An air circulation system can be constructed as shown in FIG. 6 by use of these roofing materials. FIG. 6 shows an example of application of the aforementioned combination solar cell and roofing member to the air circulation system of a house. Arrows in the drawing indicate flow of air and the external air taken in through eave part 601 is guided in space 604 between roofing materials 602 and roof underlayment 603 to be taken through ridge part 605 into the house. A fan F is provided midway of the air flow path to circulate the air. In the cold season, the air warmed up in the space 604 is taken into the room, and in the hot season, the air is discharged through exhaust port 606 to the outside, thereby enhancing heat insulation performance of the roof. A heat accumulating device may be provided below the floor.

Power generated in the combination solar cell and roofing members 602 is led through the ridge into the house and then to inverter I, thus constituting a solar electric power generation system. The output from the solar electric power generation system may be consumed at load L such as a lamp or may be sent to the commercial electrical power system E.

Photovoltaic Element 101

The photovoltaic element 101 employed in the present invention can be made of a monocrystalline, polycrystalline, microcrystalline, or amorphous semiconductor. The material is selected from silicon-based or compound-based semiconductor materials. A typical example of the photovoltaic element 101 according to the present invention is a one obtained by forming a non-monocrystalline semiconductor photoactive layer and a transparent, conductive layer on a substrate.

Figure 2A:
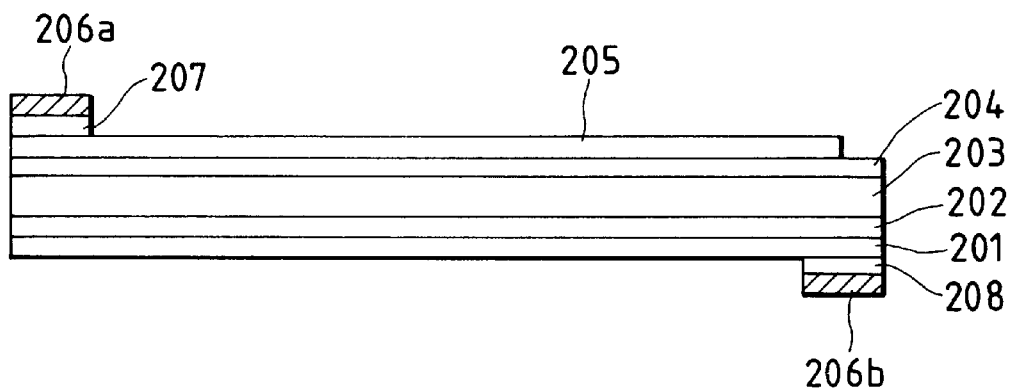
FIG. 2A and FIG. 2B are schematic views showing an example of the fundamental structure of a photovoltaic element.
Figure 2B:
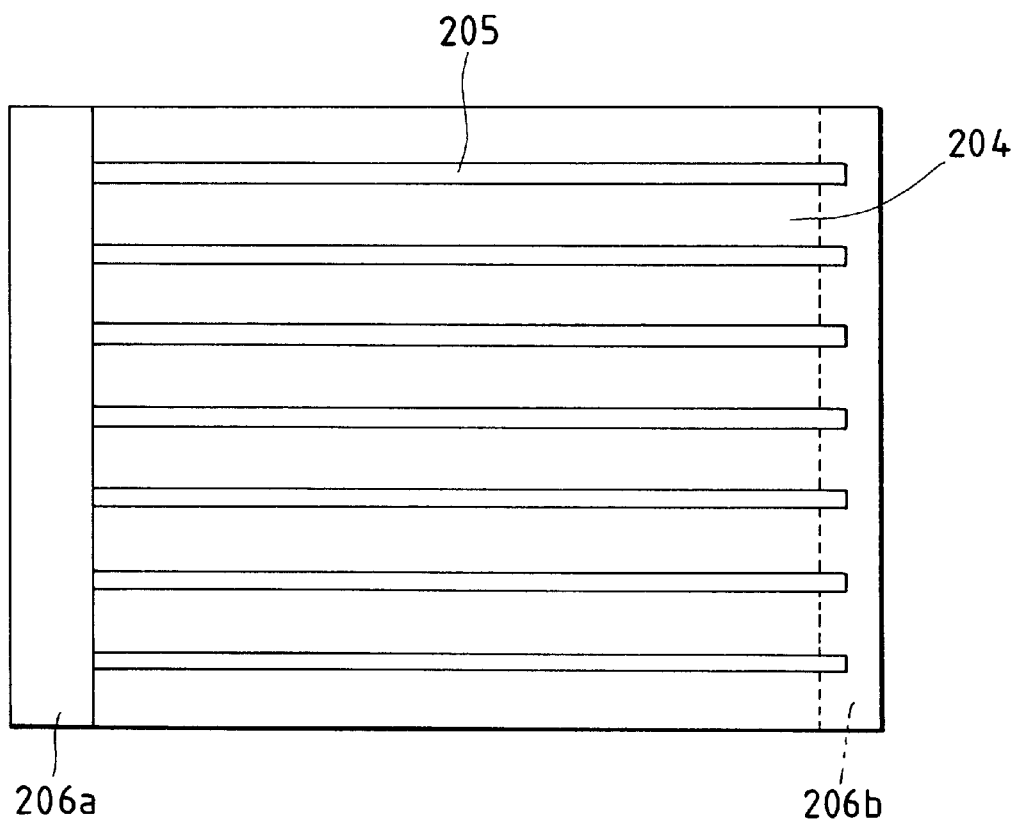

FIGS. 2A and 2B are views to show the schematic structure of the example. FIG. 2A is a cross-sectional view, and FIG. 2B is a top plan view of the light receiving surface side. In FIGS. 2A and 2B, reference numeral 201 designates a substrate, 202 a back reflecting layer, 203 a semiconductor photoactive layer, 204 a transparent, conductive layer, 205 a collector electrode pattern, and 206 output terminals.

The substrate 201 functions as a substrate of the photovoltaic element and also functions as a lower electrode. The substrate 201 may be made of a material selected, for example, from silicon, tantalum, molybdenum, tungsten, stainless steel, aluminum, copper, titanium, carbon sheet, galvanized sheet iron, or resin films or ceramics on which a conductive layer of metal or metallic oxide is formed.

A metal layer, or a metallic oxide layer, or a combination of the metal layer and metallic oxide layer may be formed as a back reflecting layer 202 on the substrate 201. The metal layer is, for example, of Ti, Cr, Mo, W, Al, Ag, or Ni, and the metallic oxide layer is, for example, of ZnO, $TiO_2$, or $SnO_2$. The back reflecting layer 202 can be made by a method selected from resistance heating vapor deposition, electron beam vapor deposition, sputtering, and so on.

The semiconductor photoactive layer 203 is responsible for photoelectric conversion. Specific examples of materials for the semiconductor photoactive layer 203 include non-monocrystalline semiconductors such as pn junction type polycrystalline silicon materials or pin junction type amorphous silicon materials, and compound semiconductors including $CuInSe_2$, $CuInS_2$, GaAs, $CdS/Cu_2S$, CdS/CdTe, CdS/InP, and $CdTe/Cu_2Te$. Among them, the non-monocrystalline semiconductors are preferably used, and amorphous silicon is more preferred.

The semiconductor photoactive layer 203 may be made by sheeting a molten silicon or by a heat treatment of amorphous silicon in the case of polycrystalline silicon; or by a plasma enhanced CVD method using silane gas or the like as a raw material in the case of amorphous silicon; or by ion plating, ion beam deposition, vacuum vapor deposition, sputtering, or electrodeposition in the case of compound semiconductors.

The transparent, conductive layer 204 serves as an upper electrode of the photovoltaic element. The transparent, conductive layer 204 may be made of a material selected, for example, from $In_2O_3$, $SnO_2$, $In_2O_3$—$SnO_2$ (ITO), ZnO, $TiO_2$, $Cd_2SnO_4$, and crystalline semiconductors doped with a high concentration of impurities. A method for forming the transparent, conductive layer 204 may be selected from resistance heating vapor deposition, sputtering, spraying, CVD, and impurity diffusion.

The collector electrode 205 (grid) of a grating pattern may be provided on the transparent, conductive layer 204, for efficiently collecting electric currents. Specific materials for the collector electrode 205 are, for example, Ti, Cr, Mo, W, Al, Ag, Ni, Cu, Sn, or conductive pastes including a silver paste. The conductive pastes usually used are those wherein fine powder of silver, gold, copper, nickel, or carbon is dispersed in a binder polymer. The binder polymer is selected, for example, from polyester, epoxy, acrylic, alkyd, polyvinyl acetate, rubber, urethane, and phenol resins.

A method for making the collector electrode 205 may be selected from sputtering with a mask pattern, resistance heating, CVD, a method of first evaporating a metal film over the entire surface and thereafter patterning it by removing unnecessary portions by etching, a method of directly forming the grid electrode pattern by photo-CVD, a method of first forming a mask of a negative pattern of the grid electrode pattern and then performing plating thereon, a method of printing a conductive paste, and a method of bonding metal wires with a conductive paste.

Finally, the output terminals 206 are attached to the substrate 201 and to the collector electrode 205, for taking out the electromotive force. Metal member 206b of a belt shape, for example, of copper is joined with the substrate 201 by soldering 208 or is electrically connected therewith by spot welding with laser. Metal member 206a of a belt shape, for example, of copper is electrically connected with the collector electrode 205 by conductive paste 207 or by soldering.

Photovoltaic elements produced by the above techniques are connected in series or in parallel, depending upon desired voltage or electric current. Another arrangement may be such that photovoltaic elements are integrated on an insulated substrate to achieve desired voltage or current.

Transparent, Rigid, Organic Resin Thin Film Layer 108

Further, the transparent, rigid, organic resin thin film layer 108 may be provided on the light incidence side of the photovoltaic element in order to present humidity resistance or scratch resistance. Examples of materials for the layer 108 are acrylic resins, silicone resins, acryl silicone resins, polyalkoxy silane resins, fluororesins, polyester resins, urethane resins, epoxy resins, alkyd resins, polysilazane resins, and so on. Materials preferred in view of weather resistance are the acrylic resins, silicone resins, acryl silicone resins, and fluororesins. More preferred materials are resins mainly containing the acrylic resin or the acryl silicone resin. These resins are preferably crosslinked to enhance heat resistance in consideration of the use of solar cell modules at high temperatures. A method for crosslinking is selected from normal methods using organic peroxide or isocyanate.

Method for Fabrication of Solar Cell Module

A normal method for covering the light receiving surface of photovoltaic element 101 by the surface sealant resin layer 102, the surface protecting film 103, and the glass fiber nonwoven fabric 106 is a method for forming a sheet of surface sealant resin and heat-pressing it on the photovoltaic element 101 together with the surface protecting film 103 and glass fiber nonwoven fabric 106. Namely, the solar cell module can be made by heat-pressing a stack in which the surface sealant resin sheet and glass fiber nonwoven fabric 106 are interposed between the photovoltaic element 101 and the surface protecting film 103. At this time, if a member having an uneven shape is placed outside of the surface protecting film 103 and is arranged to be urged against the surface protecting film 103 upon pressing, unevenness can be made readily in the surface of the surface covering member.

Heating temperature and heating time upon pressing may be determined as the occasion may demand. When the surface sealant resin layer is of a crosslinked resin, they can be determined by the temperature and time for allowing sufficient progress of the crosslinking reaction, specifically, by thermal decomposition temperature characteristics of the organic peroxide. In general, heat pressing is completed by the temperature and time which permits 90% progress of the thermal decomposition and, more preferably, 95% progress or more of the thermal decomposition.

As for the back surface, covering may be made using the back covering film 105 and back sealant resin by the same method. Since the surface sealant resin and the back sealant resin are normally the same material, the back covering step can be carried out at the same time as the above step. For example, the solar cell module can be made by stacking the surface protecting film 103/the surface sealant resin sheet/ the glass fiber nonwoven fabric 106/the photovoltaic element 101/the back sealant resin sheet/the back covering film 105 in this order to form a solar cell module laminate and heat-pressing it. The surface sealant resin sheet is melted by heating to take the glass fibers 106 into the inside thereof, thus becoming the surface sealant resin 102. The back sealant resin sheet is also melted by heating to become the back sealant resin 104 covering the back surface of photovoltaic element 101. A method for heat pressing may be selected from a variety of conventionally known methods such as vacuum lamination or roll lamination.

The solar cell module of the present invention preferably has a use temperature of 70° C. or more. This permits us to expect an effect of recovery from light degradation, particularly, of amorphous semiconductor and also permits us to enjoy the maximum yellowing suppressing effect of the surface sealant resin layer purposed by the present invention.

EXAMPLES

The present invention will be described in further detail with examples, but it is noted that the present invention is by no means intended to be limited to the examples and that the present invention can involve a variety of modifications and changes within the scope of the spirit thereof.

The following accelerated degrading tests were conducted for checking the long-term reliability of a module.

(1) Light Resistance

The solar cell modules were put in an ultra-energy irradiation test machine (available from Suga Shikenki) to be subjected to a due cycle test for repeating exposure to ultraviolet light for five hours with a metal halide lamp (exposure intensity: 100 mW/cm$^2$ at 300 nm–400 nm, atmosphere: black panel temperature 70° C./humidity 70% RH) and dew condensation (temperature 30° C./humidity 96% RH) for one hour, and then change in the appearance was observed after 2000 hours.

Observation results were indicated by o for no change and a brief comment of condition for some change.

(2) Weather Resistance

The solar cell modules were put in a sunshine weatherometer (available from Suga Shikenki) to be subjected to an accelerated weathering test for repeating 8-minute showers every two hours with exposure to light (exposure intensity: 3 SUN, atmosphere: black panel temperature 83° C./humidity 50% RH) with a xenon lamp, and change in the appearance was observed after 5000 hours. Observation results were indicated by o for no change and by a brief comment of condition for some change.

(3) Humidity Resistance

The solar cell modules were put in an environmental test machine to be kept still under the circumstances of temperature 85° C./humidity 85% RH for 1000 hours, and change in the appearance was observed. Observation results were indicated by o for no change and by a brief comment of condition for some change.

Example 1

Photovoltaic Element

Amorphous silicon (a-Si) photovoltaic elements having the structure shown in FIGS. 2A and 2B were fabricated using the following procedures.

An Al layer (5000 Å thick) and a ZnO layer (5000 Å thick) were successively made as the back reflecting layer 202 on the cleaned stainless steel substrate 201 by sputtering.

Then the tandem type a-Si semiconductor photoactive layer 203 was made in the layer structure of n-layer 150 Å thick/i-layer 4000 Å thick/p-layer 100 Å thick/n-layer 100 Å thick/i-layer 800 Å thick/p-layer 100 Å thick by making the n-type a-Si layers from a gaseous mixture of $SiH_4$, $PH_3$, and $H_2$, the i-type a-Si layers from a gaseous mixture of $SiH_4$ and $H_2$, and the p-type microcrystalline μc-Si layers from a gaseous mixture of $SiH_4$, $BF_3$, and $H_2$ by plasma enhanced CVD.

Next, a thin film of $In_2O_3$ (700 Å thick) was made as the transparent, conductive layer 204 by evaporating In under an $O_2$ atmosphere by resistance heating.

Further, the grid electrode lines as the collector electrode 205 were made by screen printing of silver paste, a copper tab as the minus output terminal 206b was attached to the substrate 201 with stainless soldering 208, and a tape of tin foil as the plus output terminal 206a was attached to the collector electrode 205 with a conductive adhesive 207, thus obtaining the photovoltaic element. The plus output terminal 206a was routed through an insulator to the back side, and the output was arranged to be taken out through holes of the back covering member described below. A plurality of photovoltaic elements were made in this way.

Formation of Module

Figure 3:
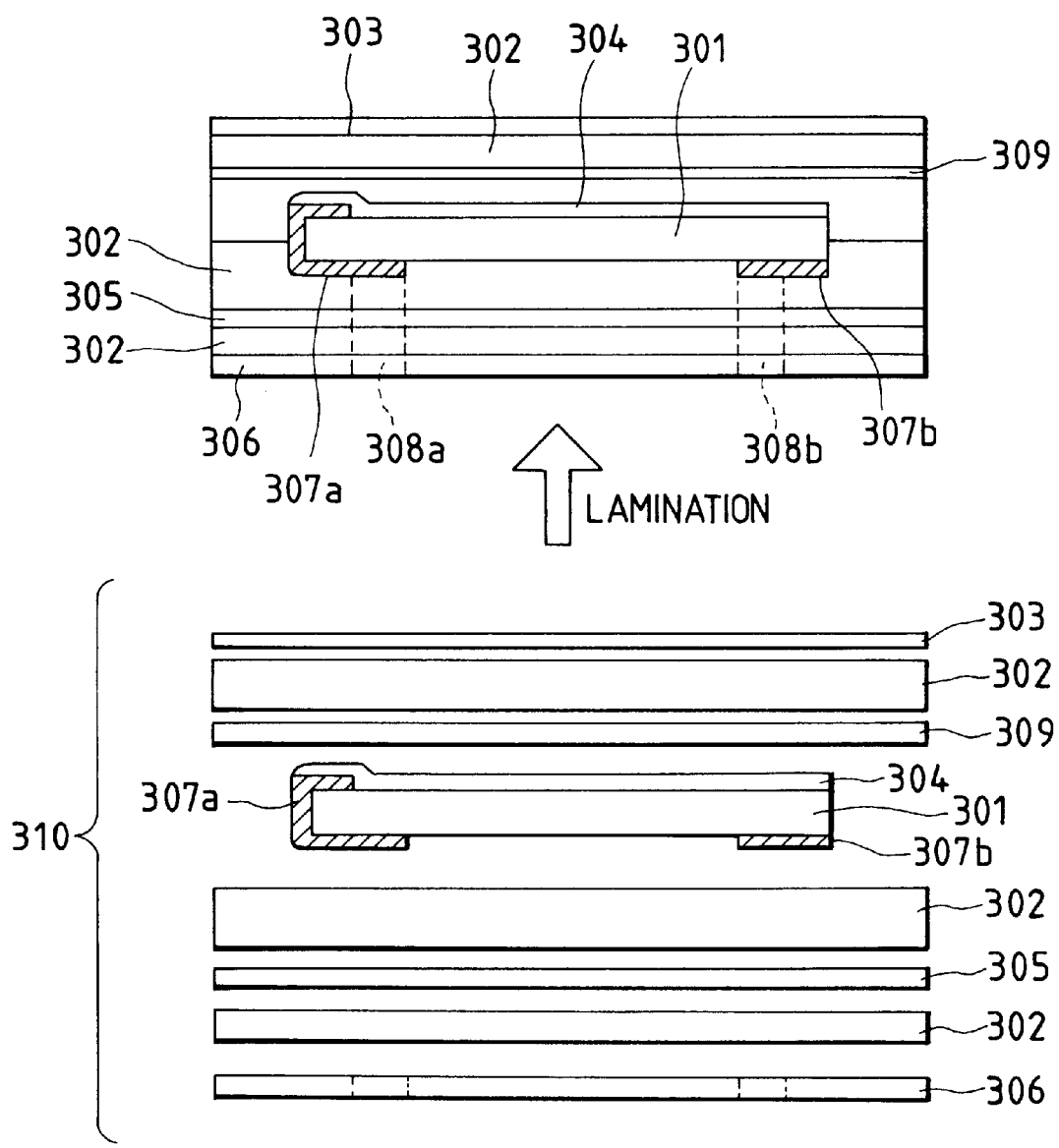
FIG. 3 is a schematic diagram of the solar cell module of Example 1.

As shown in FIG. 3, the photovoltaic element 301 obtained as described above was covered by the transparent, rigid, organic resin thin film layer 304. The transparent, rigid, organic resin thin film layer 304 was made as follows. A solution was prepared by adding 2.8 parts by weight of γ-metacryloxy propyltrimethoxy silane (trade name: SH6040, available from Toray Dow Corning Silicone Inc.) as a silane coupling agent to 100 parts by weight of a coating (trade name: Fine Hard N36-21F, resin solid content 30%, available from Showa Technocoat) in which an acrylic resin, an inorganic polymer, and hexamethylene diisocyanate blocked by ε-caprolactam were uniformly dissolved or dispersed in an organic solvent. The solution was applied by an airless spray to the light receiving surface of photovoltaic element 301, and the surface was heated at 200° C. for ten minutes to evaporate the solvent and to crosslink the resin, thus making the transparent, rigid, organic resin thin film layer 304.

The solar cell module lamination 310 was made by stacking the photovoltaic element 301, a glass fiber nonwoven fabric 309 (trade name: Glassper, basis weight 80 g/m$^2$, available from Honshu Seishi), an EVA sheet as the sealant resin layer 302 (trade name: PHOTOCAP, thickness 460 μm, available from SPRINGBORN LABORATORIES INC.), a non-oriented ETFE film having a corona-discharge-treated surface as the surface protecting film 303 (trade name: TEFZEL film, thickness 50 μm, available from DuPont Inc.), a nylon film as the back covering film 305 (trade name: Dertec, thickness 63.5 μm, available from DuPont Inc.), and a galvanized iron sheet ion as the module backing 306 (trade name: Taima color GL, thickness 0.27 mm, available from Daido Kohan) in the order of ETFE/EVA/glass fiber nonwoven fabric/element/EVA/nylon/EVA/steel sheet.

Then a stainless mesh (40×40 meshes, diameter of line 0.15 mm) was placed via a fluorocarbon film for release (trade name: Teflon PFA film, thickness 50 μm, available from DuPont Inc.) outside of the surface protecting film 303, and the lamination was heat-pressed at 150° C. for 30 minutes while degassing under pressure with a vacuum laminator, thereby obtaining the solar cell module. The amount of glass fiber nonwoven fabric was 8.7 parts by weight to 100 parts by weight of the surface sealant resin in the surface covering member of this solar cell module. On the other hand, the unevenness having the maximum level difference of 30 μm was formed in the surface of the surface covering member by the mesh.

The EVA sheet used for the sealant resin layer 302 is the one popularly used as a sealant of solar cells, in which 1.5 parts by weight of the organic peroxide as a crosslinking agent, 0.3 part by weight of the ultraviolet absorbing agent, 0.1 part by weight of the light stabilizer, 0.2 part by weight of the thermal oxidation inhibitor, and 0.25 part by weight of the silane coupling agent are blended to 100 parts by weight of the EVA resin (the content of vinyl acetate: 33%). The binder resin of the glass fiber nonwoven fabric 309 is the acrylic resin.

The output terminal 307a was preliminarily routed to the back surface of photovoltaic element 301, whereby after the lamination, the output was able to be taken out from the output terminals 307a and 307b through terminal outlets 308a, 308b preliminarily perforated in the module backing 306.

The oxygen permeability of the surface protecting film 303 used herein was 15 cc/m$^2$·24 hr·atm at 25° C./90% RH, and the water vapor permeability thereof was 11.5 g/m$^2$·24 hr at 40° C./90% RH.

The evaluation results are shown in Table 1. As apparent from Table 1, the solar cell module obtained in this example showed good results in all accelerated degradation tests.

Comparative Example 1-1

Instead of the ETFE film in Example 1, a PCTFE (polychlorotrifluoroethylene) film (trade name: Neofron CTFE, thickness 50 μm, available from Daikin Kogyo) was used as the surface protecting film 303. The PCTFE film is known as a resin having a small gas permeability among the fluororesin films. The oxygen permeability and water vapor permeability of the PCTFE film used herein were measured. The oxygen permeability thereof was 0.5 cc/m$^2$·24 hr·atm at 25° C./90% RH, and the water vapor permeability thereof was 0.3 g/m$^2$·24 hr at 40° C./90% RH.

The evaluation results are shown in Table 1. As shown in Table 1, yellowing of the surface sealant resin layer appeared in the light resistance and weather resistance tests, and the output of solar cell module was lowered by the decrease of incident light quantity caused thereby.

Comparative Example 1-2

In place of the ETFE film in Example 1, a white sheet of tempered glass for solar cells (trade name: Solatex, thickness 3.2 mm, available from AFG Inc.) was used as the surface protecting material. Using an aluminum laminate Tedlar film (available from Tokai Almi Haku) instead of the iron sheet on the back surface, the solar cell module lamination was made in the stacking order of glass/EVA/glass fiber nonwoven fabric/element/EVA/aluminum laminate Tedlar film. Then this lamination was placed with the glass down in the vacuum laminator and was heat-pressed at 150° C. for 30 minutes while degassing under pressure, thereby obtaining the solar cell module.

It is needless to mention that glass has the oxygen permeability and the water vapor permeability of zero. It is thus considered that there is no supply of oxygen to the surface sealant resin layer and no volatilization of remaining organic peroxide from the surface sealant resin layer.

The evaluation results are shown in Table 1. As shown in Table 1, yellowing of the surface sealant resin layer appeared in the light resistance and weather resistance tests and the output of solar cell module was lowered by the decrease of incident light quantity caused thereby. The degree of decrease was greater than in Comparative Example 1-1.

Example 2

The solar cell module was fabricated in the same manner as in Example 1 except that the glass fiber nonwoven fabric 309 in Example 1 was replaced by another (trade name: Craneglass, basis weight 80 g/m$_2$, available from Crane and Co., Inc.) containing the binder resin of polyvinyl alcohol.

The evaluation results are shown in Table 1. As shown in Table 1, no change was recognized in the appearance in the all tests, and good results were attained.

Comparative Example 2

The solar cell module was fabricated in the same manner as in Comparative Example 1-2 except that the glass fiber nonwoven fabric 309 in Comparative Example 1-2 was replaced by the one containing the binder resin of polyvinyl alcohol (trade name: Craneglass, basis weight 80 g/m$^2$, available from Crane and Co., Inc.).

The evaluation results are shown in Table 1. As shown in Table 1, great yellowing appeared in the surface sealant resin layer. It is conceivably due to the influence of thermal oxidation of the polyvinyl alcohol resin.

Example 3

An EEA resin (the content of ethylacrylate: 25%) formed in a sheet form was used as the sealant resin layer 302 in Example 1. Blended in this resin were 1.5 parts by weight of the organic peroxide as the crosslinking agent, 0.3 part by weight of the ultraviolet absorbing agent, 0.1 part by weight of the light stabilizer, 0.2 part by weight of the thermal oxidation inhibitor, 0.25 part by weight of the silane coupling agent, and 3.0 parts by weight of triallyl isocyanurate as the crosslinking agent. The solar cell module was fabricated in the same manner as in Example 1 except for the above.

The evaluation results are shown in Table 1. No change was recognized in the appearance in the all tests, and good results were shown as in Example 1.

Comparative Example 3

The EEA resin (the content of ethylacrylate: 25%) formed in the sheet form was used as the sealant resin layer 302 in Comparative Example 1-2. The solar cell module was fabricated in the same manner as in Comparative Example 1-2 except for the above.

The evaluation results are shown in Table 1. Yellowing of the surface sealant resin layer was recognized, though it was lighter than in the case of the EVA resin used as the surface sealant resin layer.

Comparative Example 4

The thickness of the ETFE film in Example 1 was changed to 12 μm. The solar cell module was fabricated in the same manner as in Example 1 except for that.

The oxygen permeability and water vapor permeability of the ETFE film as the surface protecting film used herein were measured, which showed that the oxygen permeability was 60 cc/m$^2$·24 hr·atm at 25° C./90% RH, and the water vapor permeability was 43 g/m$^2$·24 hr at 40° C./90% RH.

This module was subjected to the same accelerated degradation tests as in Example 1. As shown in the table, the surface film was peeled off from the sealant resin in the humidity resistance test.

TABLE

| | Light resistance | Weather resistance | Humidity resistance |
|---|---|---|---|
| Example 1 | ◯ | ◯ | ◯ |
| Example 2 | ◯ | ◯ | ◯ |
| Example 3 | ◯ | ◯ | ◯ |
| Comparative Example 1-1 | slight yellowing of surface cover | yellowing of surface cover | ◯ |
| Comparative Example 1-2 | yellowing of surface cover | yellowing of surface cover | ◯ |
| Comparative Example 2 | great yellowing of surface cover | great yellowing of surface cover | ◯ |
| Comparative Example 3 | slight yellowing of surface cover | slight yellowing of surface cover | ◯ |
| Comparative Example 4 | ◯ | ◯ | peeling of surface film |

What is claimed is:

1. A solar cell module comprising a photovoltaic element covered at the light incidence side thereof by a surface covering member comprising at least a transparent surface sealant resin layer and a transparent surface protecting film which is in contact with the transparent surface sealant resin layer and positioned at the outermost surface on the light incidence side thereof, wherein the transparent surface protecting film has a thickness of from 50 to 100 μm, wherein the use temperature of the solar cell module is 70° C. or more and wherein the oxygen permeability of said transparent surface protecting film is not less than 1 cc/m$^2$·24 hr·atm and not more than 50 cc/m$^2$·24 hr·atm at 25° C./90% RH, whereby the drop in output of the solar cell module caused by yellowing of the surface covering member when subjected to a thermal degradation test at 150° C. for 15 hours and then exposed to ultraviolet rays under the output of 100 mW/cm$^2$ in the wavelength range of 300 to 400 nm by use of a metal halide lamp is less than 10%.

2. The solar cell module according to claim 1, wherein the oxygen permeability of said transparent surface protecting film is not less than 10 cc/m$^2$·24 hr·atm and not more than 50 cc/m$^2$·24 hr·atm at 25° C./90% RH.

3. The solar cell module according to claim 1, wherein the water vapor permeability of said transparent surface protecting film is 20 g/m$^2$·24 hr or less at 40° C./90% RH.

4. The solar cell module according to claim 1, wherein said transparent surface protecting film comprises a fluoride polymer.

5. The solar cell module according to claim 4, wherein said fluoride polymer is tetrafluoroethylene-ethylene copolymer resin.

6. The solar cell module according to claim 1, wherein said transparent surface sealant resin layer comprises a crosslinked resin.

7. The solar cell module according to claim 6, wherein said crosslinked resin is ethylene-vinyl acetate copolymer (EVA) resin crosslinked by an organic peroxide.

8. The solar cell module according to claim 1, wherein said transparent surface sealant resin layer contains a nonwoven fabric of glass fiber.

9. The solar cell module according to claim 1, wherein said photovoltaic element comprises a substrate, a non-monocrystalline semiconductor active layer, and a transparent, conductive layer.

10. The solar cell module according to claim 9, wherein said non-monocrystalline semiconductor active layer comprises an amorphous silicon thin film.

11. The solar cell module according to claim 1, further comprising a transparent, rigid, organic resin thin film layer between said transparent surface sealant resin layer and said photovoltaic element, wherein the main component of the resin forming the transparent, rigid, organic resin thin film layer is either an acrylic resin or an acryl silicone resin.

12. A solar cell module comprising a photovoltaic element covered at the light incidence side thereof by a surface covering member comprising at least a transparent surface sealant resin layer and a transparent surface protecting film which is in contact with the transparent surface sealant resin layer and positioned at the outermost surface on the light incidence side thereof, wherein the transparent surface protecting film has a thickness of from 50 to 100 μm, wherein the use temperature of the solar cell module is 70° C. or more and wherein said transparent surface protecting film is sufficiently permeable to oxygen to permit the oxygen to reach said transparent surface sealant resin layer, thereby dissolving any yellow coloration of the transparent surface sealant resin layer, such that the drop in output of the solar cell module caused by yellowing of the surface covering member when subjected to a thermal degradation test at 150° C. for 15 hours and then exposed to ultraviolet rays under the output of 100 mW/cm$^2$ in the wavelength range of 300 to 400 nm by use of a metal halide lamp is less than 10%.

13. A building material comprising a photovoltaic element covered at the light incidence side thereof by a surface covering member comprising at least a transparent surface sealant resin layer and a transparent surface protecting film, which is in contact with the transparent surface sealant resin layer and positioned at the outermost surface on the light incidence side thereof, and fixed to a module backing, wherein the transparent surface protecting film has a thickness of from 50 to 100 µm, wherein the use temperature of the photovoltaic element is 70° C. or more and wherein the oxygen permeability of said transparent surface protecting film is not less than 1 cc/m²·24 hr·atm and not more than 50 cc/m²·24 hr·atm at 25° C./90% RH, whereby the drop in output of the photovoltaic element caused by yellowing of the surface covering member when subjected to a thermal degradation test at 150° C. for 15 hours and then exposed to ultraviolet rays under the output of 100 mW/cm² in the wavelength range of 300 to 400 nm by use of a metal halide lamp is less than 10%.

14. The building material according to claim 13, wherein the oxygen permeability of said transparent surface protecting film is not less than 10 cc/m²·24 hr·atm and not more than 50 cc/m²·24 hr·atm at 25° C./90% RH.

15. The building material according to claim 13, wherein the water vapor permeability of said transparent surface protecting film is 20 g/m²·24 hr or less at 40° C./90% RH.

16. The building material according to claim 13, wherein said transparent surface protecting film comprises a fluoride polymer.

17. The building material according to claim 16, wherein said fluoride polymer is tetrafluoroethylene-ethylene copolymer resin.

18. The building material according to claim 13, wherein said transparent surface sealant resin layer comprises a crosslinked resin.

19. The building material according to claim 18, wherein said crosslinked resin is ethylene-vinyl acetate copolymer (EVA) resin crosslinked by an organic peroxide.

20. The building material according to claim 13, wherein said transparent surface sealant resin layer contains a nonwoven fabric of glass fiber.

21. The building material according to claim 13, wherein said photovoltaic element comprises a substrate, a non-monocrystalline semiconductor active layer, and a transparent, conductive layer.

22. The building material according to claim 21, wherein said non-monocrystalline semiconductor active layer comprises an amorphous silicon thin film.

23. The building material according to claim 13, further comprising a transparent, rigid, organic resin thin film layer between said transparent surface sealant resin layer and said photovoltaic element, wherein the main component of the resin forming the transparent, rigid, organic resin thin film layer is either an acrylic resin or an acryl silicone resin.

24. A building material comprising a photovoltaic element covered at the light incidence side thereof by a surface covering member comprising at least a transparent surface sealant resin layer and a transparent surface protecting film, which is in contact with the transparent surface sealant resin layer and positioned at the outermost surface on the light incidence side thereof, and fixed to a module backing, wherein the transparent surface protecting film has a thickness of from 50 to 100 µm, wherein the use temperature of the photovoltaic element is 70° C. or more and wherein said transparent surface protecting film is sufficiently permeable to oxygen to permit the oxygen to reach said sealant resin, thereby dissolving any yellow coloration of the transparent surface sealant resin layer, such that the drop in output of the photovoltaic element caused by yellowing of the surface covering member when subjected to a thermal degradation test at 150° C. for 15 hours and then exposed to ultraviolet rays under the output of 100 mW/cm² in the wavelength range of 300 to 400 nm by use of a metal halide lamp is less than 10%.

25. An electric power generation system comprising a solar cell module comprising a photovoltaic element covered at the light incidence side thereof by a surface covering member comprising at least a transparent surface sealant resin layer and a transparent surface protecting film, which is in contact with the transparent surface sealant resin layer and positioned at the outermost surface on the light incidence side thereof, and a power converting device connected to said solar cell module, wherein the transparent surface protecting film has a thickness of from 50 to 100 µm, wherein the use temperature of the solar cell module is 70° C. or more and wherein the oxygen permeability of said transparent surface protecting film is not less than 1 cc/m²·24 hr·atm and not more than 50 cc/m²·24 hr·atm at 25° C./90% RH, whereby the drop in output of the solar cell module caused by yellowing of the surface covering member when subjected to a thermal degradation test at 150° C. for 15 hours and then exposed to ultraviolet rays under the output of 100 mW/cm² in the wavelength range of 300 to 400 nm by use of a metal halide lamp is less than 10%.

26. An air circulating system comprising a roofing material comprising a photovoltaic element covered at a light incidence side thereof by a surface covering member comprising at least a transparent surface sealant resin layer and a transparent surface protecting film, which is in contact with the transparent surface sealant resin layer and positioned at the outermost surface on the light incidence side thereof, and fixed to a module backing, said roofing material being fixed with a space to a roof underlayment, wherein the transparent surface protecting film has a thickness of from 50 to 100 µm, wherein air is introduced into the space and is guided through the space to be discharged outdoors or to be taken indoors, wherein the use temperature of the photovoltaic element is 70° C. and wherein the oxygen permeability of said transparent surface protecting film is not less than 1 cc/m²·24 hr·atm and not more than 50 cc/m²·24 hr·atm at 25° C./90% RH, whereby the drop in output of the photovoltaic element caused by yellowing of the surface covering member when subjected to a thermal degradation test at 150° C. for 15 hours and then exposed to ultraviolet rays under the output of 100 mW/cm² in the wavelength range of 300 to 400 nm by use of a metal halide lamp is less than 10%.

* * * * *

UNITED STATES PATENT AND TRADEMARK OFFICE
CERTIFICATE OF CORRECTION

PATENT NO.    : 6,307,145 B1
DATED         : October 23, 2001
INVENTOR(S)   : Ichiro Kataoka et al.

It is certified that error appears in the above-identified patent and that said Letters Patent is hereby corrected as shown below:

Title page,
FOREIGN PATENT DOCUMENTS, "536738 * 4/1993 (EP)." should be deleted and "680098" should read -- 0 680 098 --.

Column 1,
Line 30, "research" should read -- active research --.

Column 2,
Line 8, "a covering" should read -- the covering --.

Column 5,
Line 11, "controlled" should read -- controlled to be --; and
Line 36, "in the" should read -- in --.

Column 6,
Line 55, "to" should read -- of --.

Column 7,
Line 10, "a low" should read -- low a --; and
Line 43, "flaw" should read -- a flaw --.

Column 8,
Line 47, "backing" should read -- backing 107 --.

Column 9,
Line 33, "a one" should read -- one --.

Column 10,
Line 4, "a" (both occurrences) should be deleted.

Column 13,
Line 27, "ion" should be deleted.

UNITED STATES PATENT AND TRADEMARK OFFICE
CERTIFICATE OF CORRECTION

PATENT NO. : 6,307,145 B1
DATED : October 23, 2001
INVENTOR(S) : Ichiro Kataoka et al.

It is certified that error appears in the above-identified patent and that said Letters Patent is hereby corrected as shown below:

Column 14,
Line 39, "tests" should read -- tests, --;
Line 53, "the" (2nd occurrence) should read -- all the --; and
Line 54, "all" should be deleted.

Column 15,
Line 14, "the all" should read -- all the --.

Signed and Sealed this

Twenty-fifth Day of June, 2002

*Attest:*

JAMES E. ROGAN
*Attesting Officer*          *Director of the United States Patent and Trademark Office*